(12) United States Patent
Lee et al.

(10) Patent No.: US 9,518,758 B2
(45) Date of Patent: Dec. 13, 2016

(54) AIR CONDITIONER

(71) Applicant: SAMSUNG ELECTRONICS CO., LTD., Suwon-si (KR)

(72) Inventors: Wook Jin Lee, Seoul (KR); Sung Tae Kim, Hwaseong (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 509 days.

(21) Appl. No.: 14/047,471

(22) Filed: Oct. 7, 2013

(65) Prior Publication Data

US 2014/0117825 A1     May 1, 2014

(30) Foreign Application Priority Data

Oct. 26, 2012    (KR) .................. 10-2012-0119972

(51) Int. Cl.
| | |
|---|---|
| *H05K 7/14* | (2006.01) |
| *F24F 13/20* | (2006.01) |
| *H05K 13/00* | (2006.01) |
| *G06F 15/16* | (2006.01) |
| *H05K 5/00* | (2006.01) |
| *F24F 1/20* | (2011.01) |
| *F24F 1/22* | (2011.01) |
| *H05K 7/18* | (2006.01) |

(52) U.S. Cl.
CPC ............... *F24F 13/20* (2013.01); *F24F 1/20* (2013.01); *F24F 1/22* (2013.01); *G06F 15/161* (2013.01); *H05K 5/00* (2013.01); *H05K 7/1418* (2013.01); *H05K 7/1454* (2013.01); *H05K 7/1467* (2013.01); *H05K 7/1488* (2013.01); *H05K 13/0015* (2013.01)

(58) Field of Classification Search
CPC ... G06F 15/161; H05K 7/1467; H05K 7/1488; H05K 13/0015; H05K 13/0452; H05K 7/1418; H05K 7/1454; H05K 5/00
USPC .......... 361/796, 797, 802; 174/50, 520, 559; 312/223.1, 223.2
See application file for complete search history.

(56) References Cited

U.S. PATENT DOCUMENTS

2009/0103879 A1*    4/2009    Tang .................... G02B 6/4452
                                                         385/135

FOREIGN PATENT DOCUMENTS

| JP | 2009-296799 | 12/2009 |
|---|---|---|
| KR | 10-2003-0055048 | 7/2003 |
| KR | 10-2004-0091197 | 10/2004 |
| KR | 10-2009-0090130 | 8/2009 |

* cited by examiner

*Primary Examiner* — Binh Tran
(74) *Attorney, Agent, or Firm* — Staas & Halsey LLP

(57) ABSTRACT

An air conditioner includes a control box assembly capable of efficiently utilizing a space inside a control box and easily performing inspection and repair of a circuit unit disposed in the control box. The air conditioner includes a case that constitutes an exterior and a control box assembly mounted in the case, wherein the control box assembly includes a control box in which an accommodation portion is formed, a sliding panel having one side on which a circuit unit is mounted and being accommodated in the accommodation portion so as to be taken out of the control box, and a rotation panel having one side on which the circuit unit is mounted and being rotatably mounted at one side of the control box.

24 Claims, 14 Drawing Sheets

AIR CONDITIONER

CROSS-REFERENCE TO RELATED APPLICATIONS

This application claims the priority benefit of Korean Patent Application No. 10-2012-0119972, filed on Oct. 26, 2012 in the Korean Intellectual Property Office, the disclosure of which is incorporated herein by reference.

BACKGROUND

1. Field

The following description relates to an air conditioner including a control box assembly capable of efficiently utilizing a space inside a control box and easily performing inspection and repair of a circuit unit disposed in the control box.

2. Description of the Related Art

In general, an air conditioner is a device that keeps indoor air comfortable using a refrigerating cycle so as to be suitable for human activities. A main configuration that constitutes the refrigerating cycle includes a compressor, a condenser, an evaporator, and a blower fan.

A case that constitutes the exterior, a heat exchanger disposed in the case, a blower unit that forcibly causes the air passing through the heat exchanger to flow, and a control box assembly in which components to control the air conditioner are disposed, are provided to the air conditioner.

The control box assembly includes a control box, a printed circuit board (PCB) substrate fixed into the control box, and a cover that opens/closes the control box. Each component inside the air conditioner is electrically connected to the PCB substrate.

A control box assembly according to the related art is fixed to and installed at one inner side of the air conditioner and a PCB circuit and the like are stacked in the control box. When an obstacle occurs in the PCB substrate disposed on the control box assembly, the control box assembly is separated from the air conditioner so as to perform repair or component replacement.

SUMMARY

Therefore, it is an aspect of the present disclosure to provide an air conditioner in which control components including a printed circuit board (PCB) are separably disposed in a control box so that the control components including the PCB may be easily repaired and inspected.

It is another aspect of the present disclosure to provide an air conditioner in which control components are efficiently disposed so that not only the volume of a control box assembly but also the volume of the air conditioner may be reduced.

Additional aspects of the present disclosure will be set forth in part in the description which follows and, in part, will be apparent from the description, or may be learned by practice of the disclosure.

In accordance with one aspect of the present disclosure, there is provided an air conditioner including: a case that constitutes an exterior; and a control box assembly mounted in the case, wherein the control box assembly includes: a control box in which an accommodation portion is formed; a sliding panel having one side on which a circuit unit is mounted and being accommodated in the accommodation portion so as to be taken out of the control box; and a rotation panel having one side on which the circuit unit is mounted and being rotatably mounted at one side of the control box.

One side of the accommodation portion may be formed in a forward/backward direction so that the sliding panel is mounted to be taken out of a front of the control box.

The sliding panel may slide in the forward/backward direction by a guide rail.

The guide rail may include a fixing part and a rail part that is bent from the fixing part.

A slit may be formed in either one of top and bottom surfaces of the control box or in both of the top and bottom surfaces of the control box, and the rail part may pass through the slit and may protrude from an inner side of the control box.

The rail part may be inserted in either one of top and bottom surfaces of the sliding panel or in both of the top and bottom surfaces of the sliding panel, and a groove may be formed in a movement direction of the sliding panel.

The fixing part may be coupled to the control box and may fix the guide rail.

The other side of the accommodation portion may be formed in right and left directions, and the rotation panel may be disposed so that one side of the rotation panel on which the circuit unit is mounted directs forward.

A hinge bracket may be coupled to the rotation panel, and the hinge bracket may be rotatably mounted on the control box.

The hinge bracket may include a bracket body and a coupling portion that extends from the bracket body and is mounted on the rotation panel.

The coupling portion may include a connector that extends from the bracket body and a bent portion that is bent and extends from the connector, and the bent portion may be coupled to the rotation panel.

A slit may be formed in one side of the control box, the bent portion may pass through the slit and protrudes from an inner side of the control box, and the bent portion and sides of the rotation panel may be coupled to each other.

The hinge bracket may further include a rotation limiting portion that extends from the bracket body.

A hole through which the rotation limiting portion passes may be formed in one side of the control box.

When the rotation panel rotates, the rotation limiting portion is positioned at an outer side of the control box, and an external force applied to the rotation panel is removed, the rotation panel may descend and the rotation limiting portion may be interfered by sidewalls of the control box and may limit rotation of the rotation panel and returning to an original position of the rotation panel.

In accordance with another aspect of the present disclosure, there is provided an air conditioner including: a control box in which a circuit unit for performing control related to air conditioning or heating is accommodated; a sliding panel that is disposed in the control box, slides, and is mounted to be taken out of the control box; and a rotation panel that is rotatably mounted at one side of the control box, wherein the circuit unit is mounted at one side of the sliding panel or one side of the rotation panel, the sliding panel is disposed to be taken out of the control box so as to secure a working space for repair or inspection of the circuit unit and the circuit unit mounted at one side of the rotation panel is disposed to direct forward.

The rotation panel may be rotatably mounted on the control box by a hinge bracket.

A slit through which the hinge bracket passes may be formed in one side of the control box, portions of the hinge bracket pass through the slit and may be coupled to the rotation panel, and the other portions of the hinge bracket may be positioned at an outer side of the control box.

A rotation limiting portion that limits rotation of the rotation panel may protrude from the hinge bracket.

A hole through which the rotation limiting portion passes may be formed in one side of the control box.

When an external force is applied to the rotation panel and the rotation panel is rotated so that the rotation limiting portion passes through the hole and the external force applied to the rotation panel is removed, the rotation panel may descend and the rotation limiting portion may be interfered by sidewalls of the control box and may limit rotation of the rotation panel.

Repair or inspection of the circuit unit mounted on the sliding panel or the rotation panel may be performed in a state in which a cable connected to the circuit unit is not separated from the circuit unit.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

The present disclosure will now be described more fully with reference to the accompanying drawings, in which exemplary embodiments of the disclosure are shown.

Figure 1:
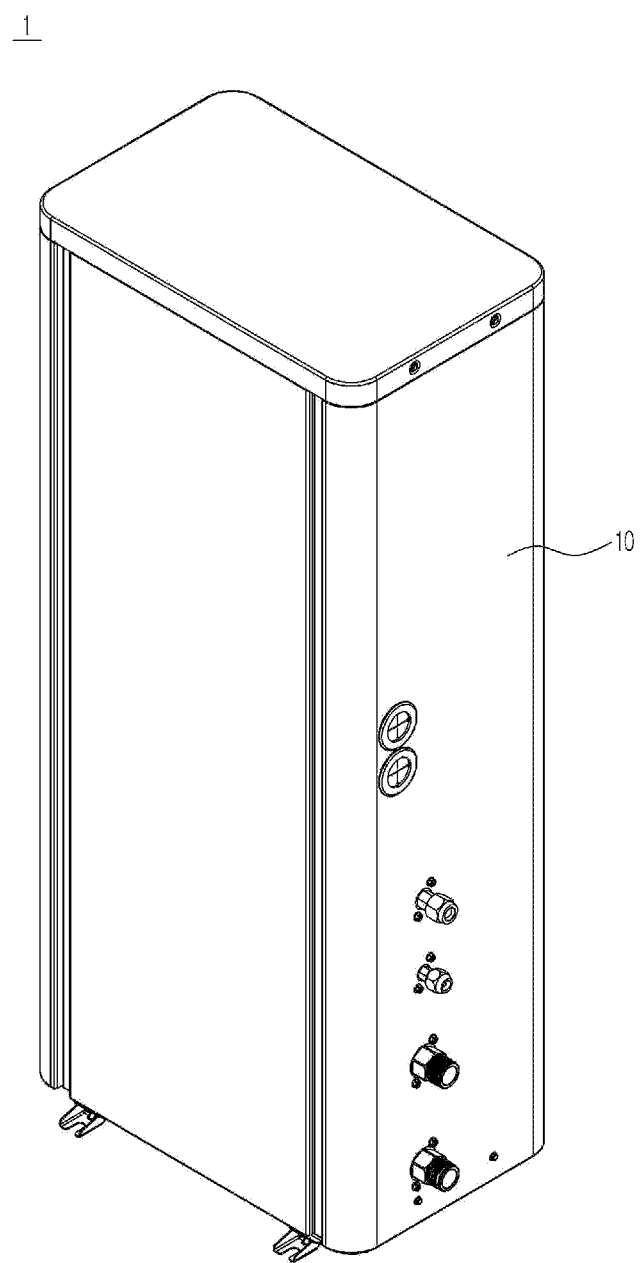
FIG. 1 is a view illustrating an air conditioner according to an embodiment of the present disclosure.
Figure 2:
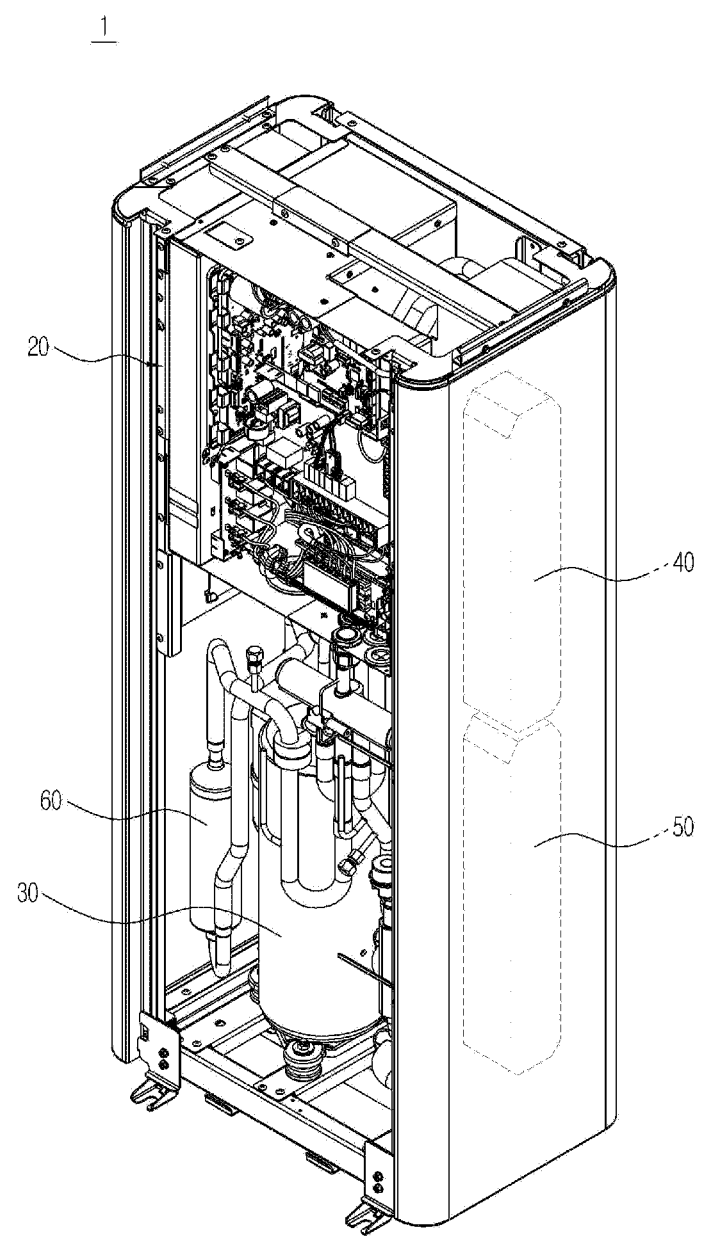
FIG. 2 is a view illustrating an inside of the air conditioner illustrated in FIG. 1.

FIG. 1 is a view illustrating an air conditioner according to an embodiment of the present disclosure, and FIG. 2 is a view illustrating an inside of the air conditioner illustrated in FIG. 1.

Referring to FIGS. 1 and 2, an air conditioner 1 according to an embodiment of the present disclosure may include a case 10, a control box assembly 20, an evaporator 40, a condenser 50, and a piping unit 60. The control box assembly 20, the evaporator 40, the condenser 50, and the piping unit 60 may be mounted in the case 10. A compressor that constitutes a refrigerating cycle may be disposed at an outdoor unit. In case of a cascade cycle type air conditioner, one compressor 30 may be further provided. The compressor 30 provided at the air conditioner 1 capable of heating using cascade compression may be mounted in the case 10.

The air conditioner 1 according to an embodiment of the present disclosure may be an air conditioner capable of air conditioning and heating. Hereinafter, the air conditioner 1 according to an embodiment of the present disclosure will be described under the assumption that it is an air conditioner capable of not only air conditioning but also heating.

A refrigerant circulates a series of refrigerating cycles configured of compression-condensation-expansion-evaporation in which the refrigerant is compressed by the compressor at a high temperature under high pressure, is phase-changed to a liquid refrigerant by the condenser 50, and is evaporated by the evaporator 40, a high-temperature air is heat-exchanged with a low-temperature refrigerant, and then a low-temperature air is supplied to the inside of a room such that air conditioning may be performed. In this case, the compressor may be a compressor disposed at the outdoor unit. The compressor disposed at the outdoor unit may dissipate heat generated when the refrigerant is compressed by the compressor, to the outside.

When the air conditioner 1 performs heating, heating may be performed using heat generated when the refrigerant is compressed by the compressor by reversely circulating the refrigerating cycle. In this case, the refrigerant compressed by the compressor disposed at the outdoor unit may be, for example, R-410A. The temperature of the refrigerant R-410A may rise up to about 55° C. if it is compressed by the compressor disposed at the outdoor unit. An outdoor cold air may be heat-exchanged with the refrigerant that is compressed by the compressor disposed at the outdoor unit at a high temperature under high pressure and may be supplied to the inside of the room.

The air conditioner 1 connected to a boiler that performs heating using high-temperature water may supply high-temperature water to the boiler. The temperature of the refrigerant R-410A compressed by the compressor disposed at the outdoor unit at a high temperature under high pressure may rise up to about 55° C. The high-temperature refrigerant heat-exchanges with, for example, a refrigerant R-134A that circulates a refrigerant pipe (not shown) disposed in the case 10, at the evaporator 40. The refrigerant R-134A heat-exchanges with the refrigerant R-410A and then is compressed by the compressor 30 disposed in the case 10. The temperature of the refrigerant R-134A compressed by the compressor 30 may rise up to about 85° C. The refrigerant R-134A that passes through the compressor 30 heat-exchanges with water at the piping unit 60. Water, of which temperature is risen by heat exchange, may flow into the boiler and may be used for heating.

In this case, the compressor (not shown) disposed at the outdoor unit may be a first compressor, and the compressor 30 disposed inside the air conditioner 1 may be a second compressor.

The first compressor or the second compressor may be an inverter compressor. The inverter compressor refers to a compressor, of which a capacity to compress the refrigerant may be controlled depending on an indoor environment. A controller that controls the compressor 30 to operate at a high speed or a low speed depending on an indoor condition in which the air conditioner 1 is installed or a user's manipulation may be provided, and a PCB substrate that constitutes the controller may be provided at the control box assembly 20.

For example, the controller disposed at the control box assembly 20 may include a first circuit unit 2 and a second circuit unit 3. For example, the first circuit unit 2 may be a circuit unit that controls an operation or a temperature of the compressor so as to prevent overload from occurring in the compressor, and the second circuit unit 3 may be a circuit unit that controls an air conditioning or heating operation of the air conditioner 1. Various sensors and switches in addition to the circuit units may be disposed at the control box assembly 20.

According to the related art, a plurality of circuit units, sensors, and switches disposed at the control box assembly 20 are stacked in and fixedly installed at the air conditioner 1. Thus, when an obstacle occurs in a component such as a PCB substrate disposed at the control box assembly 20 or the component needs to be inspected, a working space is not secured so that the control box assembly 20 should be separated from the air conditioner 1 and should be disassembled for inspection or repair.

The control box assembly 20 according to an embodiment of the present disclosure is not required to be separated from the air conditioner 1 or to be disassembled so as to perform repair or inspection of components inside the control box assembly 20 and is provided in such a way that a panel on which a circuit unit and the like are mounted slides or is rotatable. Hereinafter, a configuration of the control box assembly 20 on which the first circuit unit 2 and the second circuit unit 3 are mounted will be described in detail with reference to the following drawings.

Figure 3:
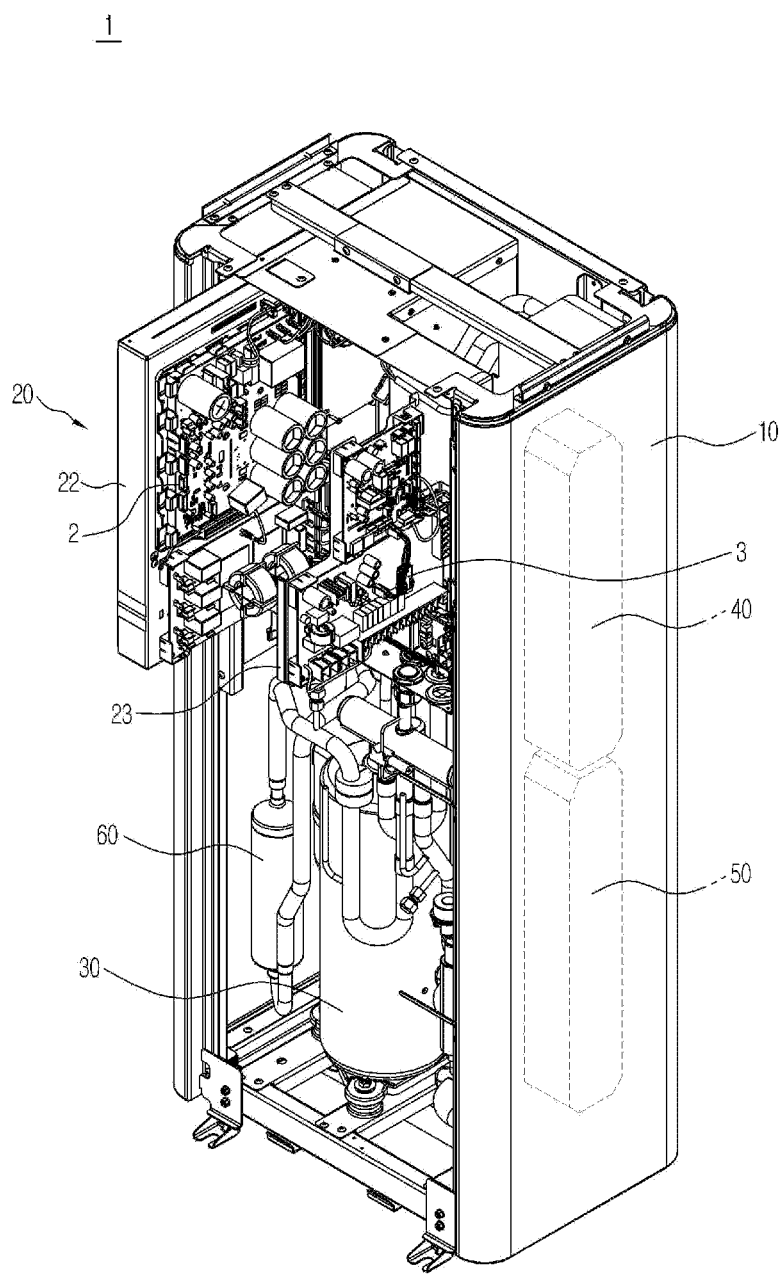
FIG. 3 is a view illustrating a state in which a control box assembly is mounted on the air conditioner of FIG. 1.
Figure 4:
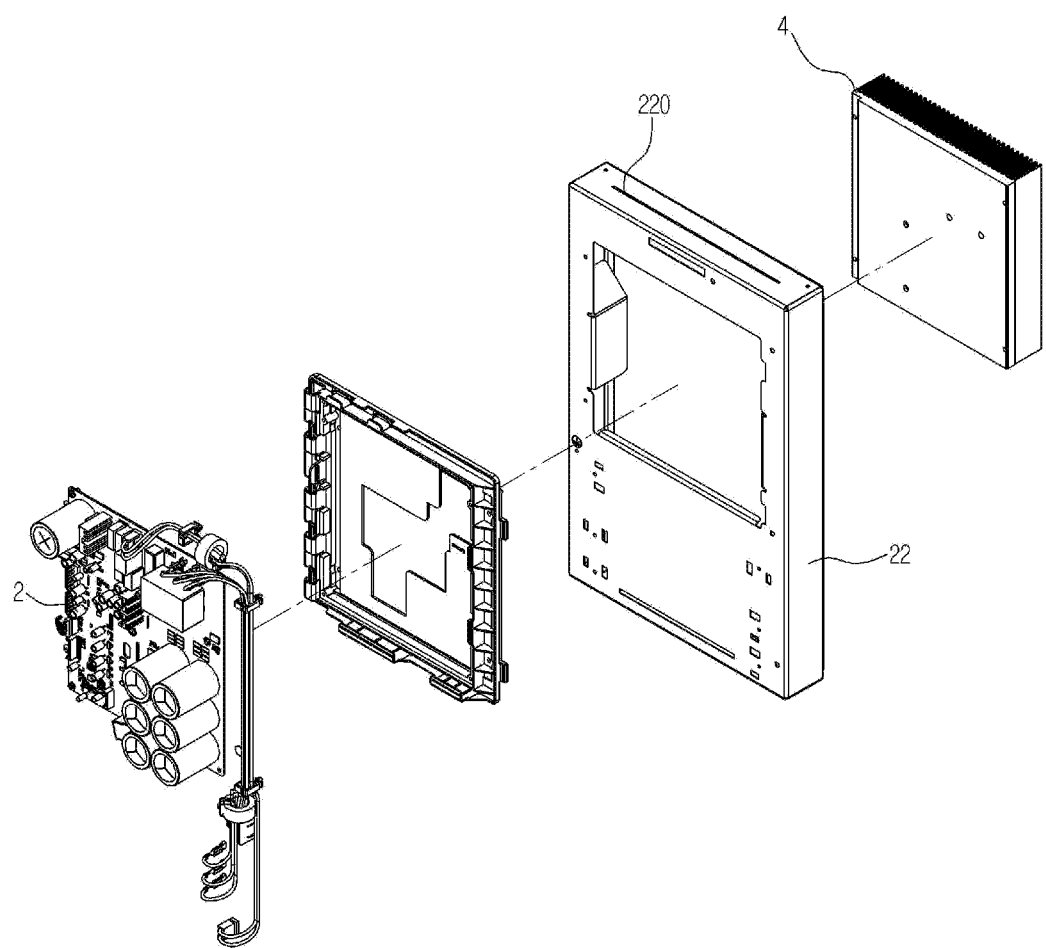
FIG. 4 is an exploded perspective view of a sliding panel according to an embodiment of the present disclosure.

FIG. 3 is a view illustrating a state in which a control box assembly is mounted on the air conditioner of FIG. 1, and FIG. 4 is an exploded perspective view of a sliding panel according to an embodiment of the present disclosure.

Referring to FIGS. 3 and 4, the control box assembly 20 according to an embodiment of the present disclosure includes a control box 21, a sliding panel 22, and a rotation panel 23. An accommodation portion 210 in which the sliding panel 22 and the rotation panel 23 may be accommodated is formed at the control box 21.

Components that constitute the controller may be mounted on the sliding panel 22 and the rotation panel 23. A PCB substrate may be mounted on the sliding panel 22 and the rotation panel 23. The PCB substrate mounted on the sliding panel 22 may be referred to as the first circuit unit 2, and the PCB substrate mounted on the rotation panel 23 may be referred to as the second circuit unit 3. The first circuit unit 2 and the second circuit unit 3 may be electrically connected to the evaporator 40, the compressor 30, the condenser 50, and a power supply unit (not shown) inside the air conditioner 1.

The sliding panel 22 may be slidably mounted in the control box 21. The sliding panel 22 may slide along a guide rail (see 25 of FIG. 5) in a forward/backward direction. The accommodation portion 210 may include a portion that is formed in the forward/backward direction so that the sliding panel 22 may be inserted in the accommodation portion 210. When inspection or repair of the first circuit unit 2 mounted on the sliding panel 22 is required, a user may take out the first circuit unit 2 from the control box 21 by allowing the sliding panel 22 to slide. As such, inspection and repair of the first circuit unit 2 may be easily performed without separating the control box assembly 20 from the air conditioner 1 or disassembling the control box assembly 20.

The guide rail 25 may be installed at either one of upper and lower parts of the control box 21 or at both of them. For example, a slit (see 213 of FIG. 6) may be formed in either one of top and bottom surfaces of the control box 21 or at both of them, and the guide rail 25 having a bent shape may be inserted in the slit 213 such that portions of the guide rail 25 may protrude from the accommodation portion 210. The sliding panel 22 may slide along the guide rail 25 that protrudes from the accommodation portion 210.

Figure 6:
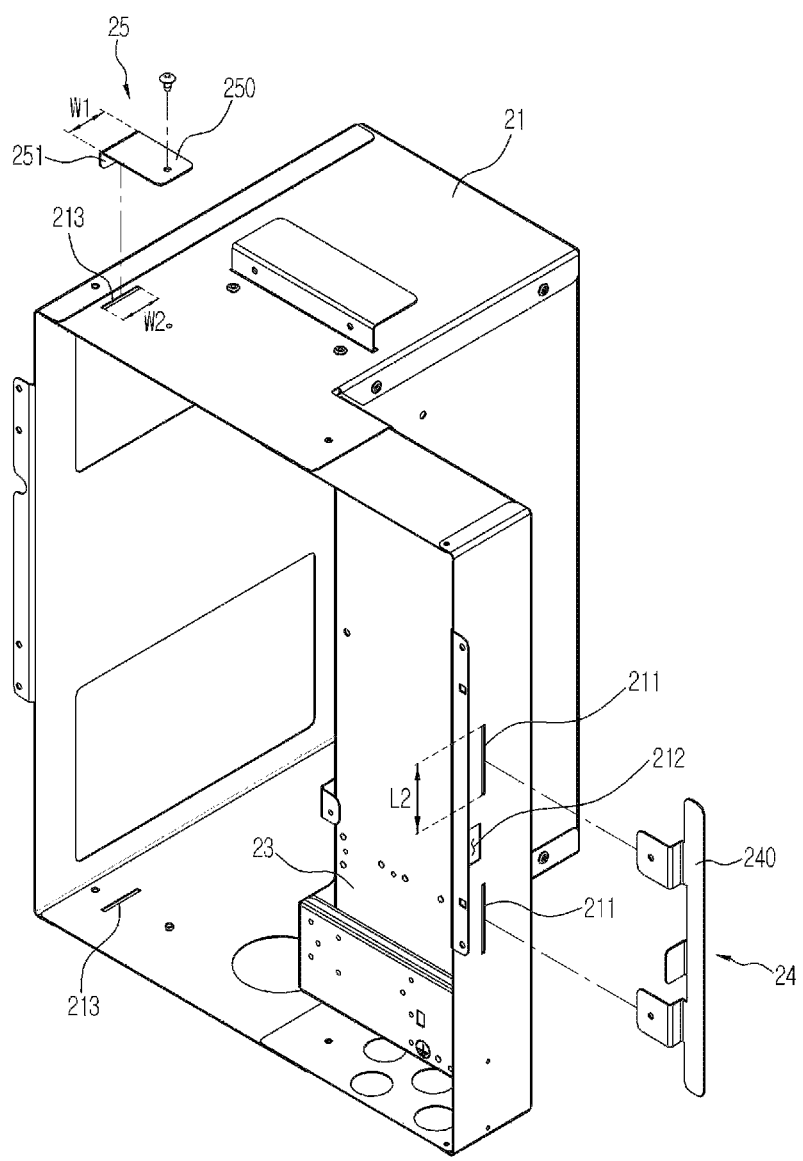

Referring to FIG. 6, the guide rail 25 includes a fixing part 250 and a rail part 251 that is bent from the fixing part 250. The rail part 251 may pass through the slit 213 and may protrude from an inner side of the control box 21. A length W2 of the slit 213 may be greater than or equal to a width W1 of the rail part 251. The fixing part 250 may be fixed to either one of outer top and bottom surfaces of the control box 21 or to both of them by a fastening member (not shown). As such, the guide rail 25 may be fixed to and installed at the control box 21. However, the guide rail may be integrated with the control box 21.

A groove 220 that is formed in a movement direction of the sliding panel 22 is provided in either one of top and bottom surfaces of the sliding panel 22 or in both of them. The groove 220 may be formed in a position corresponding to the rail part 251. One side of the rail part 251 may be inserted in the groove 220 of the sliding panel 22. In a state in which one side of the rail part 251 is inserted in the groove 220, the sliding panel 22 may slide and may be mounted in the control box 21. The sliding panel 22 may be guided by the rail part 251 and may slide.

The groove 220 may be formed in such a way that, before the sliding panel 22 is inserted in the control box 21 and collides with sidewalls of the control box 21, the rail part 251 moves to the front end of the groove 220 and the movement of the sliding panel 22 stops. Also, in order for the sliding panel 22 not to be taken out of the control box 21 and not to be separated from the control box 21, the groove 220 may be formed in such a way that, before the sliding panel 22 is separated from the control box 21, the rail part 251 moves to the rear end of the groove 220 and the movement of the sliding panel 22 stops. Since repair or inspection may be performed in a state in which the sliding panel 22 is not separated from the control box 21, repair or inspection may be performed in a state in which a cable is connected to the first circuit unit 2.

A heat sink 4 for heat dissipation of the first circuit unit 2 may be mounted at a rear side of the sliding panel 22. When the heat sink 4 needs to be cleaned so as to prevent foreign substances including dust from being attached to the heat sink 4 and heat dissipation efficiency from being deteriorated, the sliding panel 22 may be taken out of the control box 21 so as to clean the heat sink 4 disposed at a rear side of the sliding panel 22.

Figure 5:
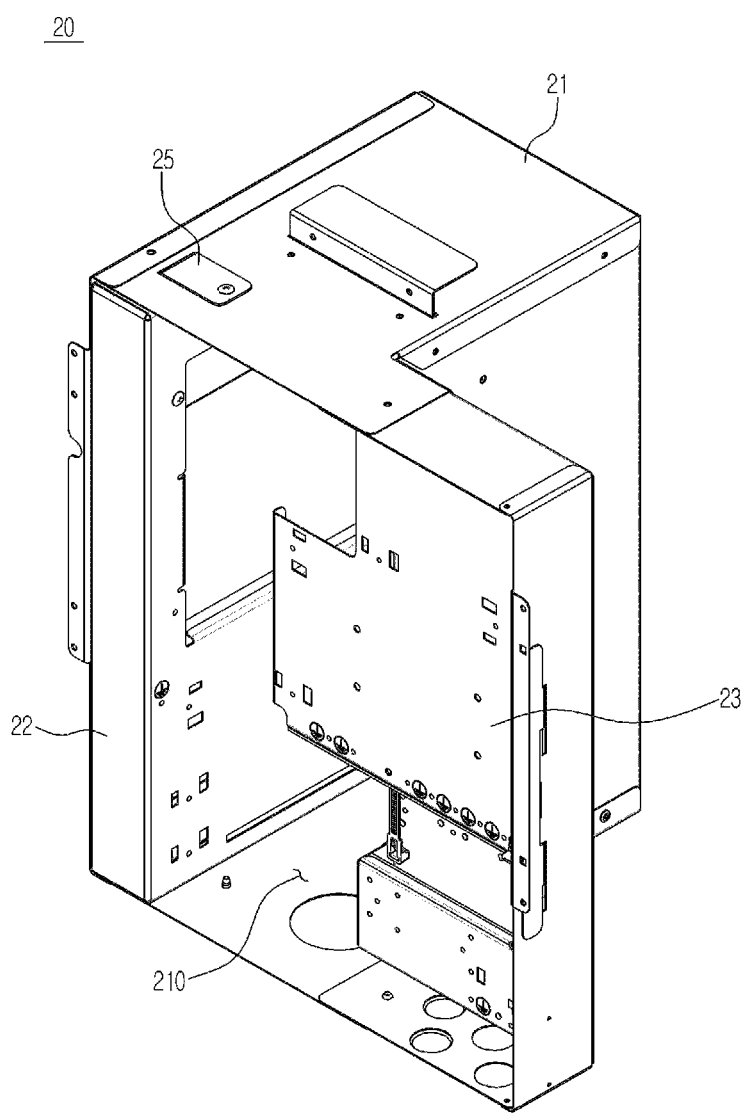
FIGS. 5 and 6 are views of a control box according to an embodiment of the present disclosure.
Figure 7:
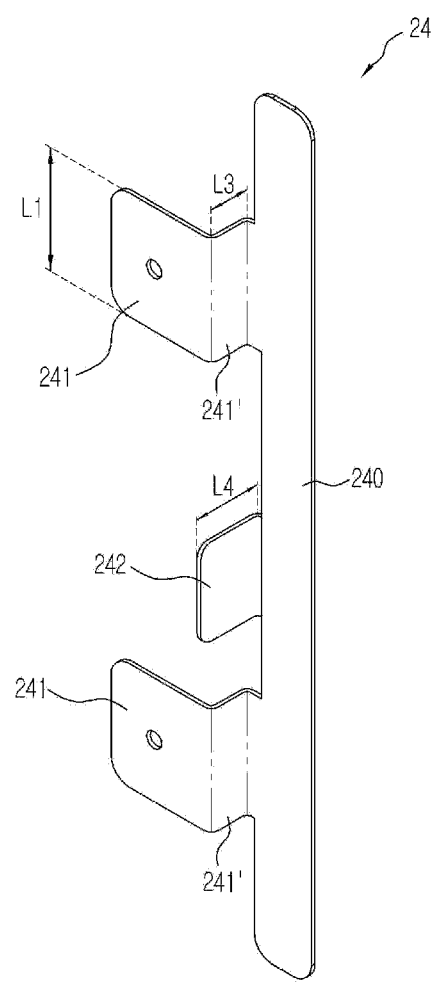
FIG. 7 is a view of a hinge bracket coupled to the control box, according to an embodiment of the present disclosure.

FIGS. 5 and 6 are views of a control box according to an embodiment of the present disclosure, and FIG. 7 is a view of a hinge bracket coupled to the control box, according to an embodiment of the present disclosure.

Referring to FIGS. 5 through 7, the rotation panel 23 is rotatably mounted at one side of the control box 21 according to an embodiment of the present disclosure. A hinge bracket 24 is mounted on the rotation panel 23. The rotation panel 23 may be rotatably mounted on the control box 21 by the hinge bracket 24.

The hinge bracket 24 includes a bracket body 240, a coupling portion, and a rotation limiting portion 242. The coupling portion and the rotation limiting portion 242 may protrude from the bracket body 240.

The coupling portion is formed to protrude from the bracket body 240 and to be bent. A portion that extends from the bracket body 240 may be referred to as a connector 241', and a portion that is bent and extends from the connector 241' may be referred to as a bent portion 241.

The bent portion 241 is coupled to sides of the rotation panel 23. A slit 211 through which the bent portion 241 passes may be formed in one side of the control box 21. The bent portion 241 may pass through the slit 211 and may be coupled to the sides of the rotation panel 23. The bent portion 241 and the rotation panel 23 may be fastened to each other by a fastening member (not shown). A length L2 of the slit 211 may be greater than a length L1 of a connection part between the connector 241' and the bracket body 240. The bent portion 241 may be formed integrally with the bracket body 240, and one or a plurality of bent portions 241 may be formed.

The rotation limiting portion 242 protrudes from the bracket body 240. The rotation limiting portion 242 may protrude from the bracket body 240 in the same direction as that of the connector 241'. A hole 212 through which the rotation limiting portion 242 passes may be formed in one side of the control box 21. As the rotation panel 23 rotates, the rotation limiting portion 242 may pass through the hole 212 and may be positioned at an inner side or an outer side of the control box 21.

Figure 8:
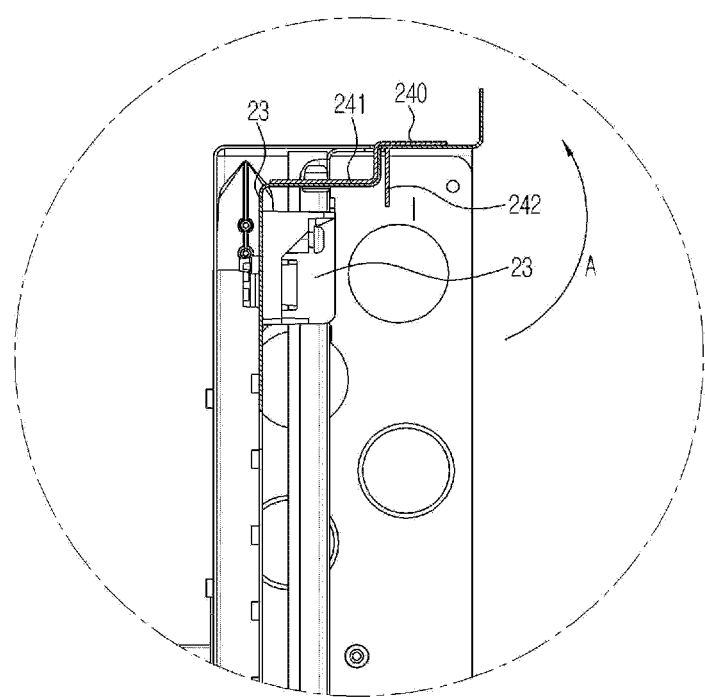
FIG. 8 is a view of a hinge bracket before a rotation panel is rotated, according to an embodiment of the present disclosure.
Figure 9:
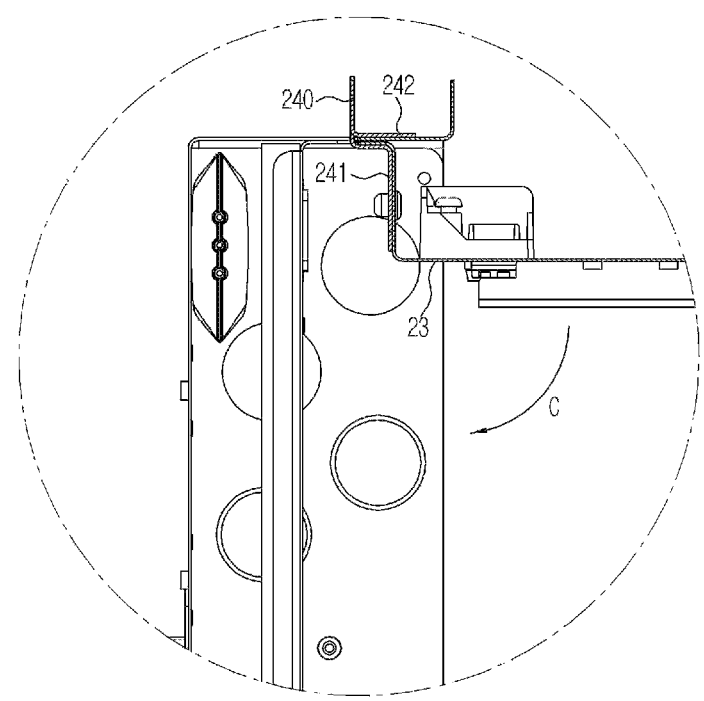
FIG. 9 is a view of the hinge bracket after the rotation panel is rotated, according to an embodiment of the present disclosure.

FIG. 8 is a view of a hinge bracket before a rotation panel is rotated, according to an embodiment of the present disclosure, and FIG. 9 is a view of the hinge bracket after the rotation panel is rotated, according to an embodiment of the present disclosure.

Referring to FIGS. 8 and 9, the rotation panel 23 according to an embodiment of the present disclosure may rotate around the connector 241' in a direction A. In detail, the rotation panel 23 that is positioned so that the second circuit unit 3 directs forward, may rotate around the connection part between the bracket body 240 and the connector 241' in the direction A. That is, a connection part (see P of FIG. 10) between the bracket body 240 and the connector 241' may be a rotation center of the rotation panel 23.

Since the bracket body 240 is positioned outside the control box 21 and the rotation panel 23 rotates in a state in which the coupling portion passes through the slit 211 formed in the control box 21 and is coupled to the rotation panel 23, interference between the rotation panel 23 and the control box 21 may not occur when the rotation panel 23 rotates. Thus, in order to avoid interference, the width or thickness of the control box 21 may be increased so as to prevent the volume of the control box 21 from unnecessarily increasing and to prevent a dead space having low space occupancy from existing in the control box 21.

As such, the size of the control box 21 may be prevented from unnecessarily increasing. The volume of the control box 21 may be minimized so that the volume of the air conditioner 1 may be prevented from unnecessarily increasing.

Figure 10:
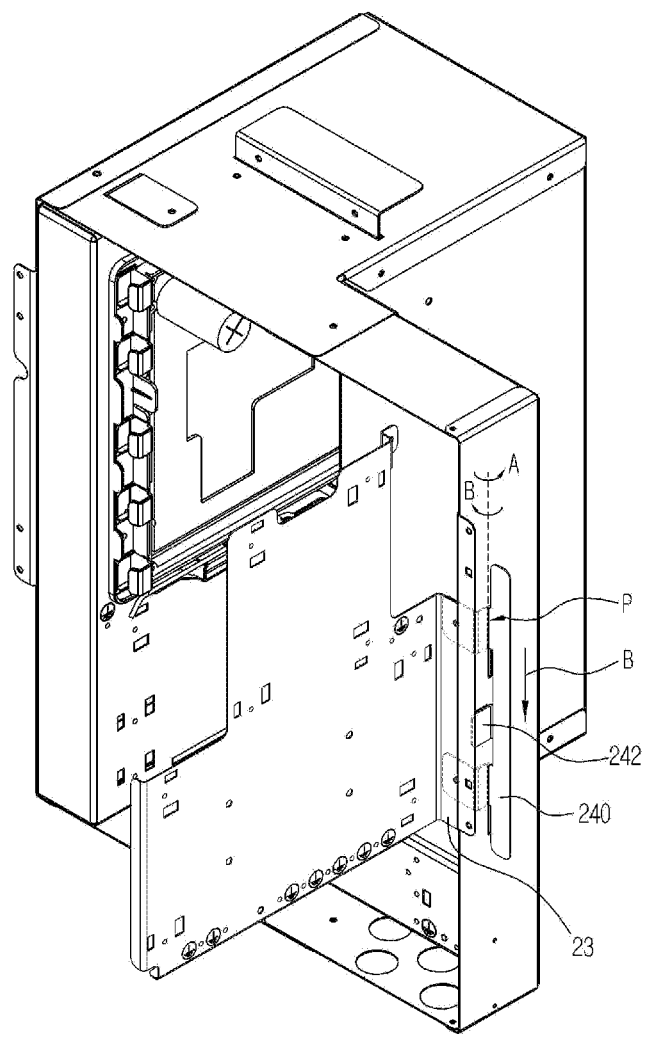
FIG. 10 is a view illustrating a rotation panel before sliding, according to an embodiment of the present disclosure.
Figure 11:
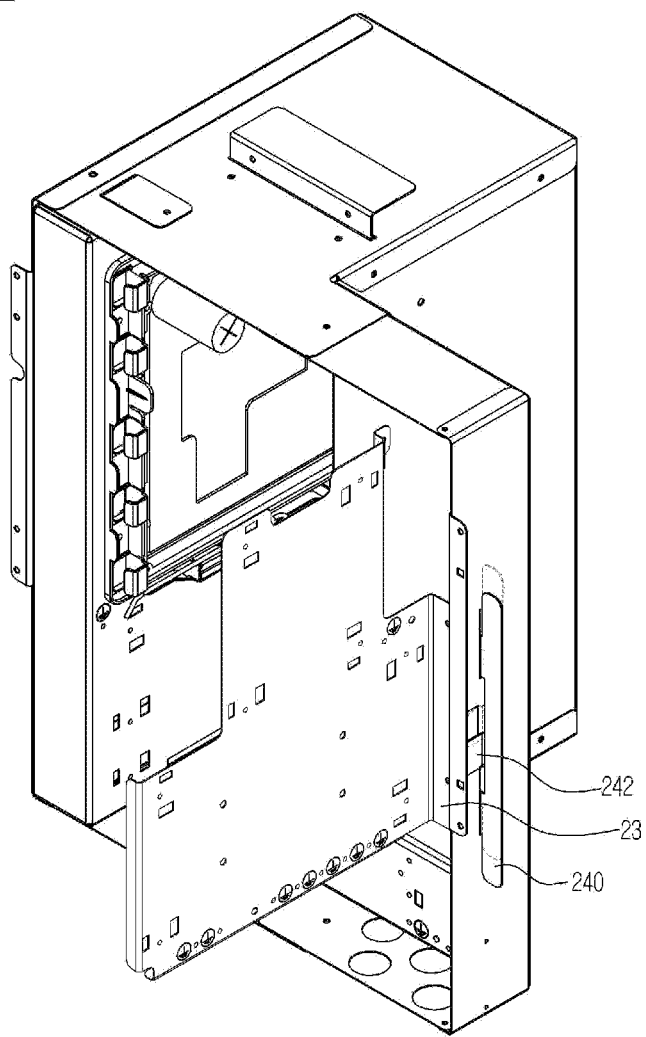
FIG. 11 is a view illustrating the rotation panel after sliding, according to an embodiment of the present disclosure.

FIG. 10 is a view illustrating a rotation panel before sliding, according to an embodiment of the present disclosure, and FIG. 11 is a view illustrating the rotation panel after sliding, according to an embodiment of the present disclosure.

Referring to FIGS. 10 and 11, when the rotation panel 23 according to an embodiment of the present disclosure rotates, the rotation limiting portion 242 may pass through the hole 212 and may be positioned at an outer side of the control box 21. If the rotation limiting portion 242 is positioned at the outer side of the control box 21 and an external force applied to the rotation panel 23 is removed, the rotation panel 23 may descend in downward direction (direction B) due to the weight of the rotation panel 23. Since the length of the slit 211 is greater than a length L1 of the connection part P between the bracket body 240 as a rotation center of the rotation panel 23 and the connector 241', the rotation panel 23 may descend in the downward direction due to its weight.

When the rotation panel 23 descends due to its weight, the rotation limiting portion 242 is placed in a position in which it may not pass through the hole 212, due to sidewalls of the control box 21. When the rotation limiting portion 242 is placed in the position in which it may not pass through the hole 212, the rotation panel 23 may be fixed not to rotate in an opposite direction to the direction A in a state in which it rotates in the direction A. Also, the rotation panel 23 is fixed by the connector 241' not to rotate in the direction A any more. Thus, the user may easily perform inspection and repair of the second circuit unit 3 mounted on the rotation panel 23 in a state in which the rotation panel 23 does not move but is fixed. In this case, since inspection or repair of the second circuit unit 3 may be performed in a state in which the rotation panel 23 is not separated from the control box 21, there is an advantage of convenience, because inspection or repair may be performed in a state in which a cable connected to the second circuit unit 3 is not separated from the second circuit unit 3.

If repair or inspection of the second circuit unit 3 mounted on the rotation panel 23 is completed, the user may lift the rotation panel 23 in an opposite direction to the direction of the weight of the rotation panel 23 so that the rotation limiting portion 242 may pass through the hole 212 and then the user may rotate the rotation panel 23 in a direction C.

Figure 12:
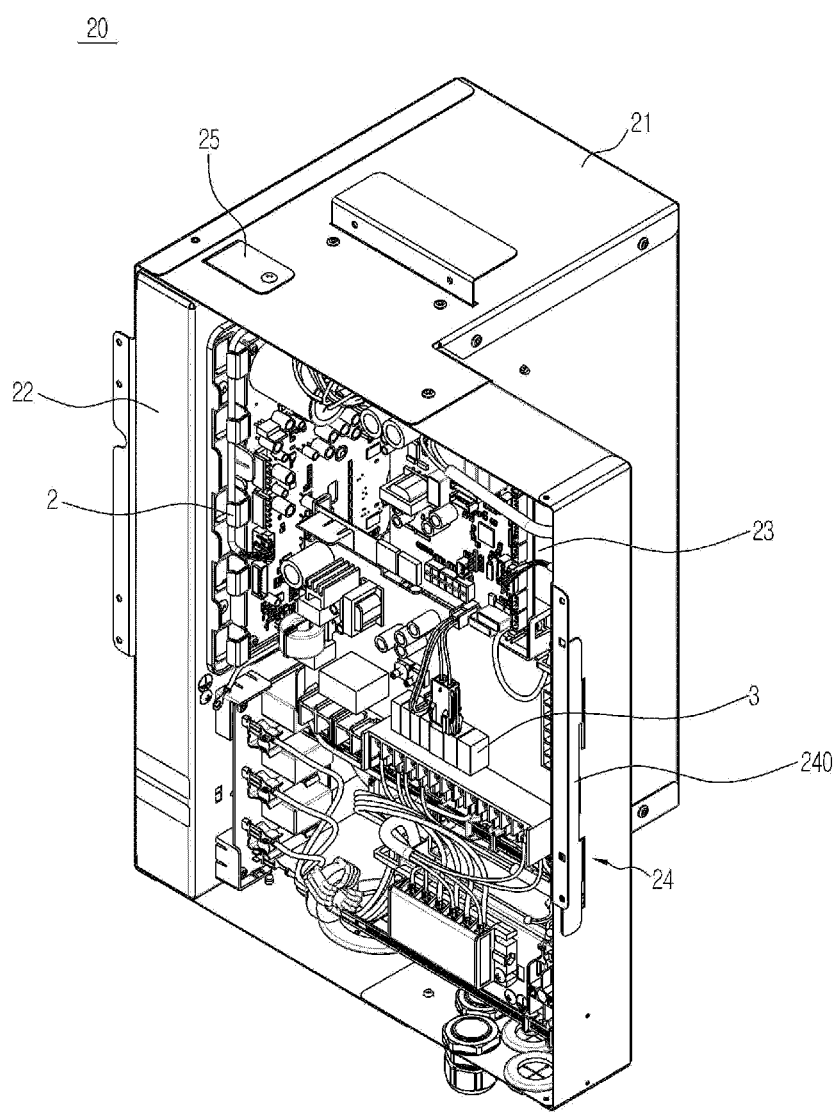
FIG. 12 is a view illustrating a state in which the sliding panel and the rotation panel are mounted in the control box, according to an embodiment of the present disclosure.
Figure 13:
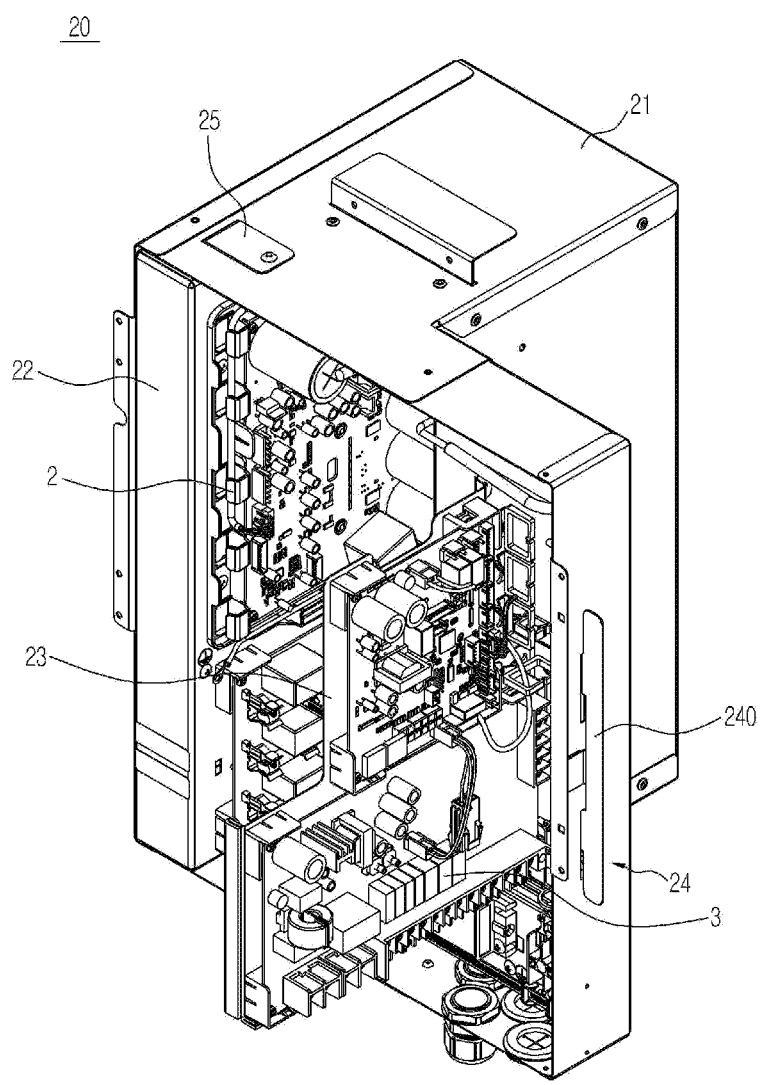
FIG. 13 is a view illustrating a state in which the rotation panel is rotated, according to an embodiment of the present disclosure.
Figure 14:
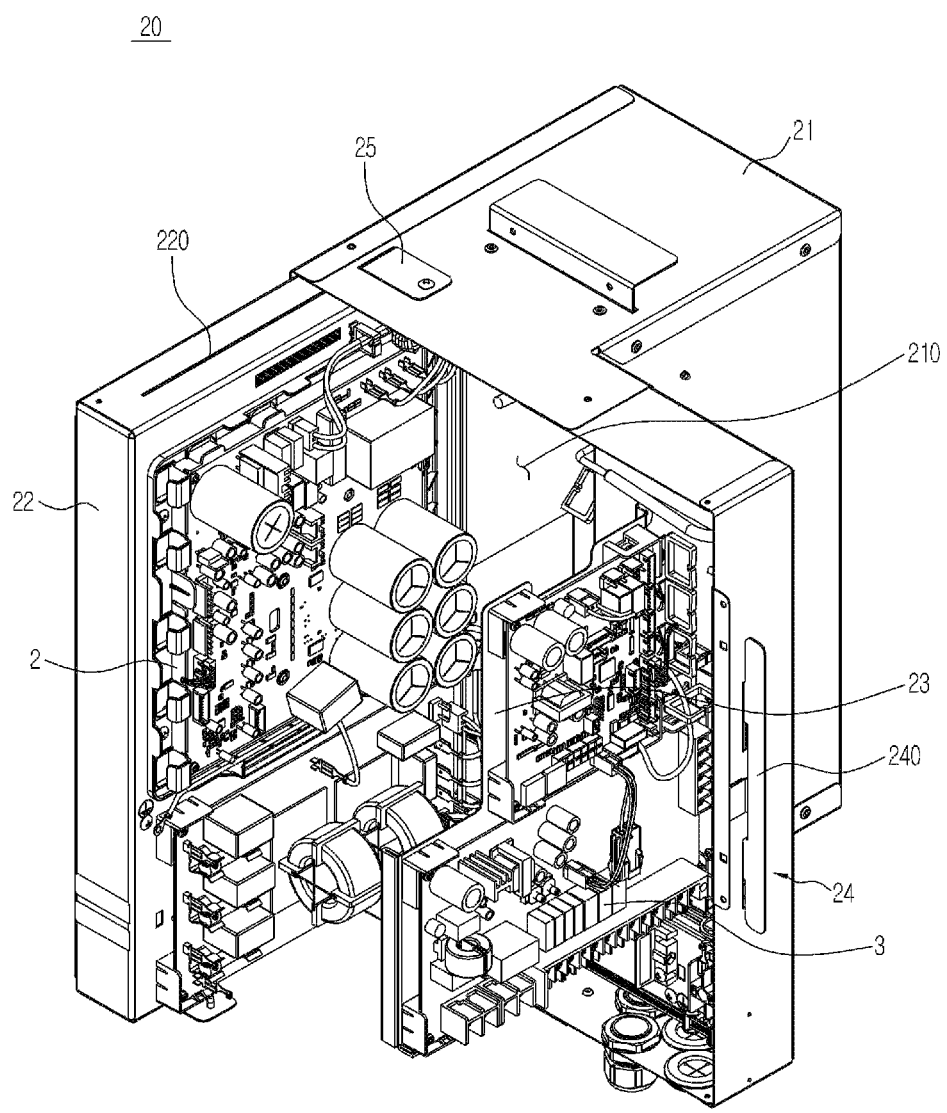
FIG. 14 is a view illustrating a state in which the rotation panel is rotated and the sliding panel is slid, according to an embodiment of the present disclosure.

FIG. 12 is a view illustrating a state in which the sliding panel and the rotation panel are mounted in the control box, according to an embodiment of the present disclosure, FIG. 13 is a view illustrating a state in which the rotation panel is rotated, according to an embodiment of the present disclosure, and FIG. 14 is a view illustrating a state in which the rotation panel is rotated and the sliding panel is slid, according to an embodiment of the present disclosure.

Referring to FIGS. 12 through 14, the accommodation portion 210 of the control box 21 according to an embodiment of the present disclosure includes a space in which the sliding panel 22 is inserted and a space in which the rotation panel 23 is mounted. The sliding panel 22 may be accommodated in one side of the accommodation portion 210 of the control box 21, and the rotation panel 23 may be accommodated in the other side of the accommodation portion 210 of the control box 21. The sliding panel 22 may be accommodated to slide from forward to backward, and the rotation panel 23 may be accommodated so that its one side directs forward.

One side of the accommodation portion 210 may be formed long from forward to backward so that the sliding panel 22 may slide from forward to backward. The length of the other side of the accommodation portion 210 in right and left directions may be long so that the second circuit unit 3 mounted on the rotation panel 23 may direct forward. That is, one side of the sliding panel 22 on which the first circuit unit 2 is mounted may be provided to face one side of the control box 21, and one side of the rotation panel 23 on which the second circuit unit 3 is mounted may be provided to direct forward.

When a component mounted on the rotation panel 23 is repaired or inspected, the user may perform repair or inspection without moving the sliding panel 22 and the rotation panel 23, as illustrated in FIG. 12. Also, in order to secure a working space, the user may perform repair or inspection after rotating the rotation panel 23, as illustrated in FIG. 13.

Components provided in the first circuit unit 2 mounted on the sliding panel 22 may protrude from the sliding panel 22. When the sliding panel 22 is taken out of the control box 21 forward, if the components of the first circuit unit 2 are interfered by the rotation panel 23, the sliding panel 22 may be taken out of the control box 21 after the user rotates the rotation panel 23, as illustrated in FIG. 14. The user may secure a sufficient working space so as to repair or inspect the first circuit unit 2 mounted on the front of the sliding panel 22 or may remove foreign substances including dust from the heat sink 4 mounted on the rear of the sliding panel 22.

As described above, the control box assembly 20 is configured so that the space occupancy of the control box assembly 20 may be improved, the volume of the control box assembly 20 may be reduced, and a sufficient working space for inspection or repair of components mounted in the control box assembly 20 may be secured without separating the control box assembly 20 from the air conditioner 1 or disassembling the control box assembly 20. Also, since other components mounted in the air conditioner 1 may be positioned in a space formed on the rear of the rotation panel 23, the space occupancy of the air conditioner 1 may be improved. Meanwhile, a plurality of sliding panels 22 or rotation panels 23 may be provided at the control box assembly 20.

As described above, in an air conditioner according to the one or more embodiments of the present disclosure, a sliding panel and a rotation panel are mounted in the control box so that the space occupancy of a control box assembly and the air conditioner may be improved, assembly of the control box assembly may be conveniently performed, and the repair and inspection of components disposed on the control box assembly may be easily performed.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. An air conditioner comprising:
   a case that constitutes an exterior; and
   a control box assembly mounted in the case,
   wherein the control box assembly comprises:
   a control box in which an accommodation portion is formed and a slit is formed in at least one of a surface top and a bottom surface of the control box;
   a sliding panel having one side on which a first circuit unit is mounted,
   the sliding panel being accommodated in the accommodation portion so as to be taken out of the control box and a groove is formed in at least one of the top and bottom surfaces of the sliding panel; and
   a rotation panel having one side on which a second circuit unit is mounted and being rotatably mounted at one side of the control box, and
   wherein the sliding panel slides along a guide rail that is inserted into the groove by passing through the slit.

2. The air conditioner according to claim 1, wherein one side of the accommodation portion is formed in a forward/backward direction so that the sliding panel is mounted to be taken out of a front of the control box.

3. The air conditioner according to claim 2, wherein the other side of the accommodation portion is formed in right and left directions, and the rotation panel is disposed so that one side of the rotation panel on which the circuit unit is mounted directs forward.

4. The air conditioner according to claim 1, wherein the sliding panel slides in the forward/backward direction along the guide rail.

5. The air conditioner according to claim 4, wherein the guide rail comprises a fixing part and a rail part that is bent from the fixing part.

6. The air conditioner according to claim 5, wherein the rail part passes through the slit and protrudes from an inner side of the control box.

7. The air conditioner according to claim 6, wherein the groove is formed in a movement direction of the sliding panel.

8. The air conditioner according to claim 5, wherein the fixing part is coupled to the control box and fixes the guide rail.

9. The air conditioner according to claim 1, wherein a hinge bracket is coupled to the rotation panel, and the hinge bracket is rotatably mounted on the control box.

10. The air conditioner according to claim 9, wherein the hinge bracket comprises a bracket body and a coupling portion that extends from the bracket body and is mounted on the rotation panel.

11. The air conditioner according to claim 10, wherein the coupling portion comprises a connector that extends from the bracket body and a bent portion that is bent and extends from the connector, and the bent portion is coupled to the rotation panel.

12. The air conditioner according to claim 11, wherein a slit is formed in one side of the control box, the bent portion passes through the slit and protrudes from an inner side of the control box, and the bent portion and sides of the rotation panel are coupled to each other.

13. The air conditioner according to claim 10, wherein the hinge bracket further comprises a rotation limiting portion that extends from the bracket body.

14. The air conditioner according to claim 13, wherein a hole through which the rotation limiting portion passes is formed in one side of the control box.

15. The air conditioner according to claim 14, wherein, when the rotation panel rotates, the rotation limiting portion is positioned at an outer side of the control box, and an external force applied to the rotation panel is removed, the rotation panel descends and the rotation limiting portion is interfered by sidewalls of the control box and limits rotation of the rotation panel and returning to an original position of the rotation panel.

16. An air conditioner comprising:
   a control box in which a first circuit unit and a second circuit unit to perform control related to air conditioning or heating are accommodated;
   a sliding panel that is disposed in the control box, slides, and is mounted to be taken out of the control box; and
   a rotation panel that is rotatably mounted at one side of the control box by a hinge bracket,
   wherein the first circuit unit is mounted at one side of the sliding panel and the second circuit unit is mounted at one side of the rotation panel, the sliding panel is disposed to be taken out of the control box so as to secure a working space for repair or inspection of the first circuit unit and the second circuit unit mounted at one side of the rotation panel is disposed to direct forward, and a slit through which the hinge bracket is formed in one side of the control box, portions of the hinge bracket pass through the slit and are coupled to the rotation panel, and other portions of the hinge bracket are positioned at an outer side of the control box.

17. The air conditioner according to claim 16, wherein a rotation limiting portion that limits rotation of the rotation panel protrudes from the hinge bracket.

18. The air conditioner according to claim 17, wherein a hole through which the rotation limiting portion passes is formed in one side of the control box.

19. The air conditioner according to claim 18, wherein, when an external force is applied to the rotation panel and the rotation panel is rotated so that the rotation limiting portion passes through the hole and the external force applied to the rotation panel is removed, the rotation panel descends and the rotation limiting portion is interfered by sidewalls of the control box and limits rotation of the rotation panel.

20. The air conditioner according to claim 16, wherein repair or inspection of the first circuit unit mounted on the sliding panel or the second circuit unit mounted on the rotation panel is performed in a state in which a cable connected to the first circuit unit and/or the second circuit unit is not separated from the first circuit unit and/or the second circuit unit.

21. A control box assembly for a heater or an air conditioner in which components to control the heater or the air conditioner are provided, the control box assembly comprising:

a control box;

a sliding panel which slides in and out of the control box and a first circuit unit is mounted on one side thereof;

a rotating panel which is rotated in and out of the control box and a second circuit unit is mounted on one side thereof; and at least one guide rail along which the sliding panel slides, and wherein the control box includes at least one slit into which an insertion portion of the corresponding at least one guide rail is inserted and the sliding panel includes at least one groove provided in a position corresponding to the insertion portion and formed in a movement direction of the sliding panel.

22. The control box assembly of claim 21, further comprising a hinge bracket which is coupled to the rotation panel and rotatably mounted on the control box.

23. The control box assembly of claim 22, wherein the control box includes at least one slit into which a portion of the hinge bracket is inserted and is formed in a portion of the control box, the portion of the hinge bracket inserted into the slit and are coupled to the rotation panel, and the other portion of the hinge bracket are positioned at an outer side of the control box.

24. The control box assembly of claim 23, wherein the hinge bracket includes a rotation limiting portion that limits rotation of the rotation panel protrudes from the hinge bracket and a hole through which the rotation limiting portion is inserted and is formed in one side of the control box.

* * * * *